(12) United States Patent
Ono et al.

(10) Patent No.: US 7,435,294 B2
(45) Date of Patent: Oct. 14, 2008

(54) METHOD FOR MANUFACTURING SILICON SINGLE CRYSTAL, AND SILICON WAFER

(75) Inventors: Toshiaki Ono, Tokyo (JP); Wataru Sugimura, Tokyo (JP); Masataka Hourai, Tokyo (JP)

(73) Assignee: Sumco Corporation, Tokyo (JP)

(*) Notice: Subject to any disclaimer, the term of this patent is extended or adjusted under 35 U.S.C. 154(b) by 0 days.

(21) Appl. No.: 11/393,809

(22) Filed: Mar. 31, 2006

(65) Prior Publication Data

US 2006/0225640 A1 Oct. 12, 2006

Related U.S. Application Data

(60) Provisional application No. 60/712,126, filed on Aug. 30, 2005.

(30) Foreign Application Priority Data

Apr. 8, 2005 (JP) ............................. 2005-112836
Jul. 13, 2005 (JP) ............................. 2005-204102

(51) Int. Cl.
*C30B 15/20* (2006.01)

(52) U.S. Cl. .............................. 117/19; 117/13; 117/20

(58) Field of Classification Search .................... 117/13, 117/19, 20
See application file for complete search history.

(56) References Cited

U.S. PATENT DOCUMENTS 6,843,848 B2 * 1/2005 Von Ammon et al. ......... 117/19

7,048,796 B2 * 5/2006 Watanabe et al. ............. 117/19
7,211,141 B2 * 5/2007 Kobayashi .................... 117/19
2002/0081440 A1 6/2002 Murakami et al.

FOREIGN PATENT DOCUMENTS

| JP | 08-330316 | 12/1996 |
|---|---|---|
| JP | 11-302099 | 11/1999 |
| JP | 2000-281491 | 10/2000 |
| JP | 2001-220289 | 8/2001 |
| JP | 2001-226195 | 8/2001 |
| JP | 2001-274165 | 10/2001 |
| JP | 2001-335396 | 12/2001 |
| JP | KR 2002-0050111 | 6/2002 |
| JP | 2002-187794 | 7/2002 |
| JP | 2005-060153 | 3/2005 |
| WO | WO 2004/083496 | 9/2004 |

* cited by examiner

*Primary Examiner*—Felisa C Hiteshew
(74) *Attorney, Agent, or Firm*—Clark & Brody

(57) ABSTRACT

A silicon single crystal is manufactured by growing said crystal composed of a defect-free area free from the Grown-in defects by the CZ process, adding a gas of a hydrogen atom-containing substance to an atmosphere gas within a growing apparatus, and doping nitrogen and/or carbon in the crystal. Therefore, a wafer the whole surface of which is composed of the defect-free area free from the Grown-in defects and which can sufficiently and uniformly form BMD can be easily sliced. Such a wafer can be extensively used, since it can significantly reduce generation of characteristic defectives of integrated circuits to be formed thereon and contribute for improving the production yield as a substrate responding to the demand for further miniaturization and higher density of the circuits.

5 Claims, 7 Drawing Sheets

METHOD FOR MANUFACTURING SILICON SINGLE CRYSTAL, AND SILICON WAFER

This application claims benefit of 60/712,126, filed Aug. 30, 2005.

FIELD OF THE INVENTION

The present invention relates to a method for manufacturing silicon single crystal which is a raw material for a silicon wafer used as a substrate for semiconductor integrated circuit, and a silicon wafer produced from the single crystal.

DESCRIPTION OF THE PRIOR ART

To manufacture a single crystal of silicon, from which a silicon wafer used for a substrate for semiconductor integrated circuit (device) is cut out, a growing method by the Czochralski process (hereinafter referred to as CZ process) has been most commonly adopted. The CZ process comprises the steps of growing a single crystal by immersing and pulling up seed crystal in and from molten silicon within a quartz crucible, and the progress of this growing technique enables production of a dislocation-free large single crystal with least defects.

A semiconductor device is made into a product through a number of processes for circuit formation by using a wafer obtained from single crystal as a substrate. In these processes, many physical treatments, chemical treatments and further thermal treatments are applied, including a fierce treatment at a temperature exceeding 1000° C. Therefore, a minute defect, which is caused at the time of growing the single crystal and manifests itself in the manufacturing process of the device to significantly affect the performance of the device, i.e., the Grown-in defect becomes a problem.

In order to manufacture a wafer free from the Grown-in defect, it has been adopted to perform a thermal treatment to the wafer after processing, in which the defect-free part obtained thereby is limited to a surface layer part thereof Accordingly, in order to ensure a sufficiently defect-free area up to a position deep from the surface, the defect-free part must be formed in the single crystal growing stage. Such a defect-free single crystal has been obtained by use of a growing method with an improved structure of a part of single crystal, to be the raw material, that is cooled just after solidification in pulling operation, i.e., a hot zone, and by a process for adding hydrogen to an apparatus internal atmosphere during growing.

FIG. 1 is a view illustrating a typical distribution state of the Grown-in defects present in silicon single crystal obtained by the CZ process. The Grown-in defects in silicon single crystal obtained by the CZ process include a vacancy defect with a size of about 0.1-0.2 µm called a defective infrared ray (IR) scatterer or COP (crystal originated particle) and a defect consisting of minute dislocation with a size of about 10 µm called a dislocation cluster. The distribution of these defects in general pulling-growing process is observed, for example, as shown in FIG. 1. This drawing schematically shows the result of distribution observation for the minute defects by X-ray topography of a wafer surface, which was cut from single crystal in as-grown state along the plane perpendicular to the pulling axis, immersed in an aqueous solution of copper nitrate to deposit Cu onto the wafer, and then thermally treated.

In this wafer, an oxygen induced stacking fault (hereinafter referred to as OSF) distributed in a ring shape emerges in a position of about ⅔ of the outer diameter, about $10^5$-$10^6$ pieces/cm$^3$ of IR scatterer defects are detected on the inside area of this ring, and about $10^3$-$10^4$ pieces/cm$^3$ of dislocation cluster defects are present on the outside area part thereof.

OSF is a stacking defect resulted from oxygen precipitation caused in an oxidation heat treatment, and when it is generated and grown on a wafer surface that is the device active area, a leak current is caused to deteriorate device characteristics. The IR scatterer is a factor causing the deterioration of initial gate oxide integrity, and the dislocation cluster also causes a characteristic failure of the device formed thereon.

FIG. 2 is a view schematically showing a general relation between pull-up speed and crystal defect generation position in pulling up single crystal with reference to the defect distribution state in a section of single crystal grown when the pull-up speed is gradually reduced. In general, the defect generation state is greatly affected by the pull-up speed in growing the single crystal and the internal temperature distribution of the single crystal just after solidification. For example, when the single crystal grown while gradually reducing the pull-up speed is cut along the pulling axis of the crystal center, and this section is examined for defect distribution in the same manner as FIG. 1, the result shown in FIG. 2 can be obtained.

In observation of a plane perpendicular to the pulling axis of the single crystal, in a stage with high pull-up speed at trunk part after forming a shoulder part to have a required single crystal diameter, the ring-like OSF is present in the periphery of the crystal, while many IR scatterer defects are generated on the inside area. The diameter of the ring-like OSF is gradually reduced in accordance with reduction of the pull-up speed, and an area with generation of the dislocation clusters comes into existence in an outer area of the ring-like OSF accordingly. The ring-like OSF then disappears, and the whole surface is occupied by the dislocation cluster defect generation area.

FIG. 1 shows the wafer of the single crystal in the position A of FIG. 2 or the wafer grown at pull-up speed corresponding to the position A.

Further detailed examinations of the defect distribution show that both the IR scatterer defects and the dislocation cluster defects scarcely exist in the vicinity of the area with the ring-like OSF. An oxygen precipitation promotion area where oxygen precipitation arises depending on the treatment condition is present on the outer side adjacent to the ring-like OSF generation area, and an oxygen precipitation inhibition area causing no oxygen precipitation is present between the oxygen precipitation promotion area and a dislocation cluster generation area further outside thereof The oxygen precipitation promotion area and the oxygen precipitation inhibition area are defect-free areas with extremely fewer Grown-in defects similarly to the ring-like OSF generation area.

The cause of these defects is not necessarily cleared, but can be assumed as follows. When single crystal of solid phase is grown from a melt of liquid phase, large quantities vacancies lacking in atoms and atoms excessively fitted between lattices are taken into crystal lattices of solid phase in the vicinity of the solid-liquid interface. The taken vacancies or interstitial atoms disappear by mutual combining or reaching the surface by diffusion in the step of reducing the temperature decrease with the progression of solidification. The vacancies are taken relatively more than the interstitial atoms at higher diffusion speed. Accordingly, if the cooling rate is high with an increased pull-up speed, the vacancies are left behind and combined together to cause the IR scatterer defects, and if the pull-up speed is low, the vacancies disappear, and the remaining interstitial atoms form the dislocation cluster defects.

In the area in which the vacancies and the interstitial atoms are well-balanced in number, combined and extinguished, a defect-free area with extremely fewer IR scatterer defects or dislocation cluster defects is obtained. However, even within the defect-free area, the ring-like OSF is likely to generate in a position adjacent to the area with the generation of a number of IF scatterer defects. The oxygen precipitation promotion area is present on the further outside thereof or on the low speed side. The area is considered to be a defect-free area where the vacancies are predominant, thus referred to the $P_V$ area. The oxygen precipitation inhibition area is present on the further outside thereof. This area is considered to be a defect-free area where interstitial elements are predominant, thus referred to the $P_I$ area.

Since the IR scatterer defects cause no adverse effects so much as the dislocation clusters, and are effective to improve the productivity and the like, the single crystal growing was conventionally performed with increased pull-up speed, so that the generation area of the ring-like OSF is located on the periphery of the crystal. However, in an area where IR scatterer defects are generated, a heat treatment for removing bulk defects in a layer for forming integrated circuits on a wafer surface or a DZ (denuded zone) formation treatment is performed, whereby an oxygen precipitate (BMD: bulk-microdefect) having an intrinsic gettering (IG) effect may be easily formed within the wafer.

In accordance with further miniaturaization of integrated circuits by recent requests of smaller sizes and higher densities, however, the IR scatterer defect also becomes a serious cause of reduction in yield of good product, and reduction of the generation density thereof has come to be an important subject. Therefore, a single crystal growing method with an improved hot zone structure has been proposed to extend the defect-free area to the whole wafer surface.

In an invention disclosed in Japanese Patent Application Publication No. 8-330316, for example, when the pull-up speed in single crystal growing is given by V (mm/min), and the temperature gradient in the pulling axial direction in a temperature range from a melting point to 1300° C. is given by G (° C./mm), the temperature gradient is controlled so that V/G is 0.20-0.22 $mm^2/(° C. min)$ in an internal position from the crystal center to 30 mm from the outer circumference, and gradually increased toward the crystal outer circumference.

As examples of such a method for actively controlling the temperature distribution within the crystal just after solidification, inventions for a technique of making the crystal internal temperature gradient in the pulling axial direction to be large in the center part and to be small in the outer circumferential part by proper selection of the dimension and/or position of a heat shielding body surrounding the single crystal, and/or by use of a cooling member and the like are disclosed in Japanese Patent Application Publication Nos. 2001-220289 and 2002-187794.

The crystal internal temperature gradient in the pulling axial direction is generally large in a peripheral part and small in a central part since the single crystal under pulling just after solidification is cooled by heat dissipation from the surface. Namely, when the pulling axial temperature gradient of the center part is given by Gc, and that of the peripheral part is given by Ge, the relation of Gc<Ge is established.

In the above-mentioned inventions of Japanese Patent Application Publication Nos. 2001-220289 and 2002-187794, Gc>Ge is ensured in a temperature range from the melting point to about 1250° C. by improvements of the hot zone structure by means of such as the proper selection of the dimension and/or position of the heat shielding body surrounding the single crystal just after-solidification, and/or the use of the cooling member.

Namely, the surface part of the single crystal under pulling is thermally insulated for retention of heat, in the vicinity of a portion raised from the melt, by heat radiation from the crucible wall surface or the melt surface, and the upper part of the single crystal therefrom is enforced to be more intensively cooled by use of the heat shielding body, the cooling member and/or the like, whereby the center part is cooled by heat transfer so as to have a relatively large temperature gradient.

FIG. 3 is a view schematically describing the defect distribution state in a section of single crystal pulled by a growing apparatus having a hot zone structure in which the temperature gradient in the pulling direction of the single crystal just after solidification is smaller in the crystal peripheral part (Ge) than in the crystal center part (Gc) (Gc>Ge). Consequently, when the single crystal is grown at varied pull-up speeds in the same manner as the case shown by FIG. 2, the generation distribution of each defect within the single crystal is changed as shown in FIG. 3. When the pulling-growing process is performed within a speed range of B to C in FIG. 3 by use of the growing apparatus with the hot zone structure thus improved, the single crystal with a trunk part mostly composed of the defect-free area is obtained, and a wafer with extremely fewer Grown-in defects can be manufactured.

The process for adding hydrogen to the apparatus internal atmosphere under growing is disclosed in Japanese Patent Application Publication Nos. 2000-281491 and 2001-335396 for example, and the like, in which the pulling-growing process of the single crystal is performed in an atmosphere with hydrogen added. In the process, when hydrogen is added to the atmosphere, hydrogen is blended into silicon melt according to its quantity, partially taken into the solidifying single crystal and, consequently, the number of the Grown-in defects is reduced with a decrease in size thereof.

It is assumed that hydrogen taken into the crystal in the form of doping couples with vacancies inhibits the dispersing behavior of the vacancies, or reduces the intake of interstitial atoms due to the same effect as the interstitial atoms, while it easily diffuses and disperses at high temperature in the cooling process thus likely probably resulting in the reduction of the defects. However, since it is impossible to perfectly eliminate the defects only by the addition of hydrogen to the atmosphere, a wafer cut out from the single crystal thus obtained is made into a defect-free wafer by further performing a heat treatment thereto at high temperature in an atmosphere containing hydrogen.

In International Publication WO2004/083496, an invention for a method for growing single crystal free from the Grown-in defects using the effect of hydrogen is disclosed, in which using a growing apparatus with a hot zone structure improved to ensure above-mentioned Ge<Gc, pulling is performed while supplying hydrogen-containing inert gas into the apparatus.

When the temperature distribution within the single crystal just after solidification is set to Ge<Gc, a pull-up speed range capable of making the whole surface of a wafer section as shown by B-C of FIG. 3 to an area free from the Grown-in defects is obtained, and growing at this pull-up speed enables formation of the single crystal entirely free from defects. However, since this speed range is narrow, an increased diameter of the single crystal makes it impossible to obtain the speed range capable of making the whole wafer surface into the defect-free area, or makes it difficult to stably make the straight trunk part of the single crystal free from defects throughout the length. According to the inventive method of International Publication WO2004/083496, since the space between B-C of FIG. 3 is extended to widen the pull-up speed range capable of making the whole wafer surface into the defect-free area, the single crystal free from the Grown-in defects can be easily grown at speed higher than in the past.

SUMMARY OF THE INVENTION

The present invention relates to a method for manufacturing silicon single crystal composed of a defect-free area free from the Grown-in defects, and a wafer made of the crystal by applying the same. As a technique of growing the defect-free single crystal, it is known to use an apparatus with a hot zone structure adopted so that the temperature gradient in the pulling axial direction of the single crystal just after solidification is larger in the center part than in the outer circumferential part, and limit the pull-up speed to a specific range.

According to this manufacturing method, single crystals in which a defect-free area free from the Grown-in defects are extended over the whole surface of a wafer can be obtained. However, it is not always easy to obtain such single crystals free from defects with sufficient generation of BMD having an intrinsic gettering effect, the BMD formed uniformly over the whole surface in the wafer surface direction.

It is an objective of the present invention to provide a method for manufacturing silicon single crystal which is to easily obtain a wafer with a defect-free area and to generate BMD uniformly and sufficiently and to provide a silicon wafer produced from the single crystal.

The present invention can be summarized by a method for manufacturing silicon single crystal according to the following (1) to (6) and by a silicon wafer according to the following (7) to (9).

(1) A method for manufacturing a silicon single crystal by the Czochralski process, comprising the steps of: growing a silicon composed of a defect-free area free from the Grown-in defects by the CZ process; adding a gas made of a hydrogen atom-containing substance to an atmosphere gas within a growing apparatus; and doping nitrogen and/or carbon in the crystal.

(2) A method for manufacturing a silicon single crystal, comprising the steps of growing a silicon single crystal composed of a defect-free area free from the Grown-in defects by the CZ process; setting nitrogen in the single crystal to $1\times10^{12}$ atoms/cm$^3$ or more and $5\times10^{14}$ atoms/cm$^3$ or less; setting hydrogen partial pressure in an atmosphere gas within a growing apparatus to 40 Pa or more and 400 Pa or less; and pulling up a trunk part of single crystal within a speed range to cause no generation of the Grown-in defects.

(3) A method for manufacturing a silicon single crystal, comprising the steps of growing a silicon single crystal composed of a defect-free area free from the Grown-in defects by the CZ process; setting nitrogen in the single crystal to $1\times10^{12}$ atoms/cm$^3$ or more and $5\times10^{14}$ atoms/cm$^3$ or less; setting hydrogen partial pressure in an atmosphere gas within a growing apparatus to 40 Pa or more and 400 Pa or less; and pulling up a trunk part of single crystal within a speed range to cause the formation of a vacancy-predominant defect-free area.

(4) A method for manufacturing a silicon single crystal, comprising the steps of: growing a silicon single crystal composed of a defect-free area free from the Grown-in defects by the CZ process; setting carbon in the single crystal to $5\times10^{15}$ atoms/cm$^3$ or more and $2\times10^{17}$ atoms/cm$^3$ or less (ASTM F123-1981); setting hydrogen partial pressure in atmospheric gas within a growing apparatus to 40 Pa or more and 160 Pa or less; and pulling up a trunk part of single crystal within a speed range to cause no generation of the Grown-in defects.

(5) A method for manufacturing a silicon single crystal, comprising the steps of: growing a silicon single crystal composed of a defect-free area free from the Grown-in defects by the CZ process; setting carbon in the single crystal to $5\times10^{15}$ atoms/cm$^3$ or more and $2\times10^{17}$ atoms/cm$^3$ or less (ASTM F123-1981); setting hydrogen partial pressure in an atmosphere gas within a growing apparatus to 40 Pa or more and 160 Pa or less; and pulling up a trunk part of single crystal within the total speed range of to cause the generation of an OSF area along with a vacancy-predominant defect-free area ($P_V$ area).

(6) A method for manufacturing a silicon single crystal, comprising the steps of growing a silicon single crystal composed of a defect-free area free from the Grown-in defects by the CZ process; setting nitrogen in the single crystal to $1\times10^{12}$ atoms/cm$^3$ or more and $5\times10^{14}$ atoms/cm$^3$ or less; setting carbon in the single crystal to $5\times10^{15}$ atoms/cm$^3$ or more and $2\times10^{17}$ atoms/cm$^3$ or less (ASTM F123-1981); setting hydrogen partial pressure in an atmosphere gas within a growing apparatus to 40 Pa or more and 400 Pa or less; and pulling up a trunk part of single crystal within a speed range to cause no generation of the Grown-in defects.

(7) A silicon wafer cut out from a silicon single crystal grown by the method according to (1), (2), (3), (4), (5) or (6).

(8) A silicon wafer cut out from a silicon single crystal grown by the method according to (1), (2), (3), (4), (5) or (6), which has an oxygen concentration of $1.2\times10^{18}$ atoms/cm$^3$ or more (ASTM F121-1979).

(9) A silicon wafer cut out from a silicon single crystal grown by the method according to (1), (2), (3), (4), (5) or (6), which is further subjected to a rapid thermal annealing (RTA) treatment.

According to the method for manufacturing a silicon single crystal of the present invention, a silicon single crystal for cutting out a wafer, the whole surface of which is composed of the defect-free area free from the Grown-in defects, and which can sufficiently and uniformly form BMD, can be easily manufactured. Such a wafer can significantly reduce generation of characteristic defectives of integrated circuits to be formed thereon and contribute for improving the production yield as a substrate responding to the demand for further miniaturaization and higher density of the circuits.

DESCRIPTION OF PREFERRED EMBODIMENTS

In order to obtain a wafer being uniform over the whole wafer surface and free from the Grown-in defects, the present inventors have made various investigations for the effects of setting Ge<Gc for the crystal internal temperature distribution during pulling as well as adding hydrogen to the apparatus internal atmosphere.

It is disclosed in International Publication WO 2004/083496 that in the growing apparatus with improvement in the hot zone structure, the apparatus internal atmosphere is configured to be an inert gas atmosphere with hydrogen added thereto, whereby the pull-up speed range capable of forming an area free from the Grown-in defects can be extended, and defect-free single crystal can be grown at pull-up speed higher than in the past.

However, as a result of the attempts of growing single crystal by the method described in International Publication WO 2004/083496, it was found that the limit range of hydrogen partial pressure was far extensive and its effect is not always clearly shown. Therefore, the influence of the extent of hydrogen partial pressure was further examined. As a result, it became clear that a new effect emerges when the hydrogen partial pressure is limited to a specified range.

It is assumed that the effect obtained by mixing hydrogen into the internal atmosphere gas in the apparatus under growing is caused by that hydrogen contained in a chemically inactive gas such as argon, which is generally used as the atmospheric gas, is migrated and blended into silicon melt in proportion to the hydrogen partial pressure, and distributed into the solidifying the silicon crystal.

The hydrogen which migrates and blends into the melt is meager since the quantity of hydrogen mixed into the atmosphere is small, and the inside space of apparatus is kept in a reduced pressure lower than the atmospheric pressure. Accordingly, the relation that the concentration $L_H$ of hydrogen in a state where the blending quantity is equilibrated is proportional to the hydrogen partial pressure $P_H$ in the atmosphere, or the Henry's law for a diluted solution of an element in a gas phase expressed by the following formula should be established.

$$L_H = kP_H \; (k: \text{coefficient}) \quad (1)$$

In this regard, the defect generation state was examined by use of a growing apparatus with an improved hot zone structure by variously changing the hydrogen partial pressure in the atmosphere and the pull-up speed. The hydrogen partial pressure in the atmosphere is represented by the following equation, given that the atmospheric gas pressure in the inside of apparatus is $P_0$, and the volume ratio of the hydrogen contained in the atmospheric gas introduced is $X(\%)$.

$$P_H = P_0 X/100 \quad (2)$$

Accordingly, to hold the hydrogen partial pressure or the hydrogen concentration within the melt in constant at different atmospheric gas pressures within the apparatus, the volume ratio of hydrogen to be mixed must be changed according to the equation (2).

Figure 1:
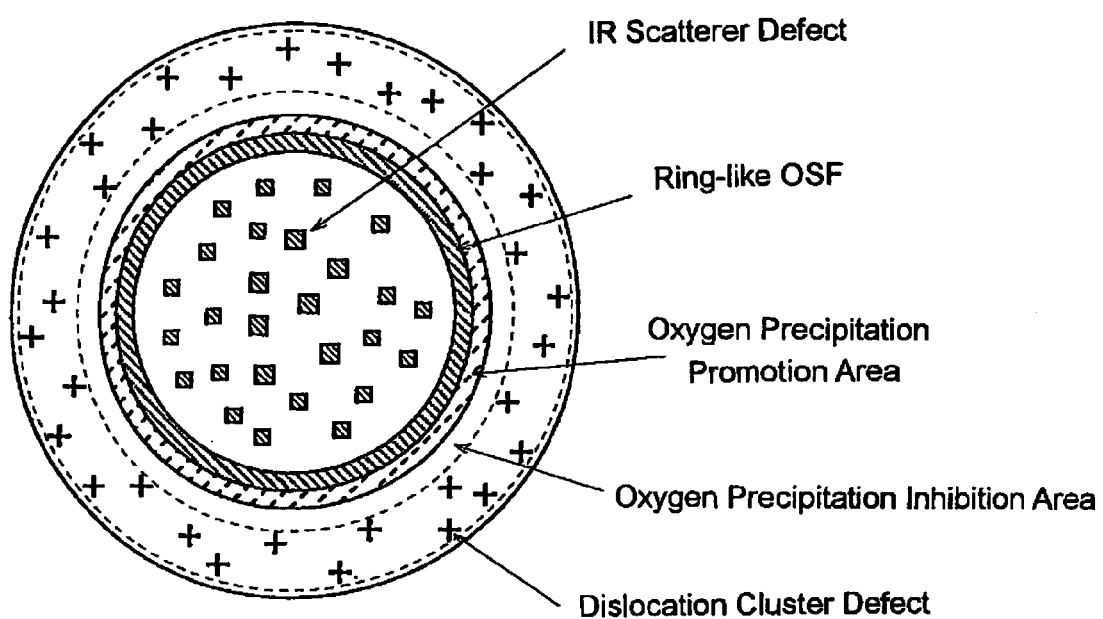
FIG. 1 is a view schematically showing an example of typical defect distribution observed in a silicon wafer.
Figure 2:
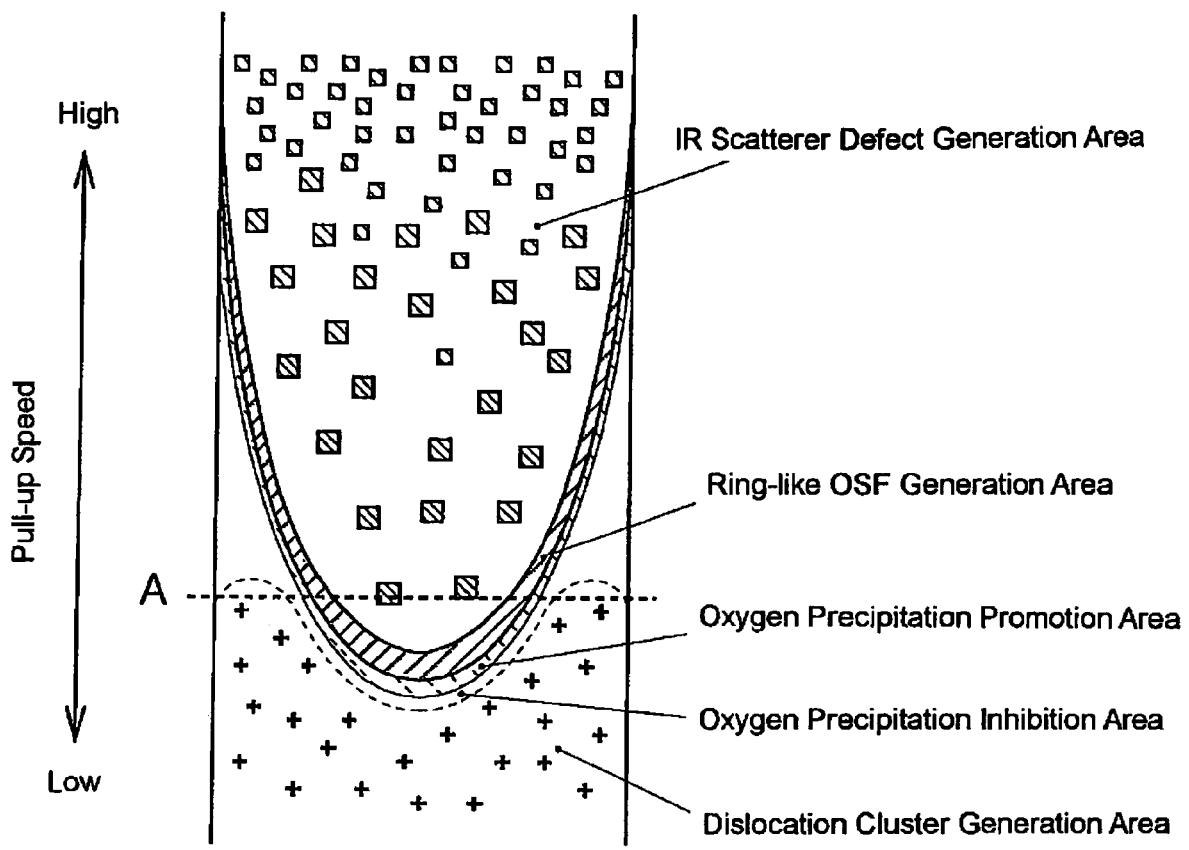
FIG. 2 is a view schematically illustrating a general relation between pull-up speed and crystal defect generation position in pulling up the single crystal by a defect distribution state in a section of single crystal grown while gradually reducing the pull-up speed.
Figure 3:
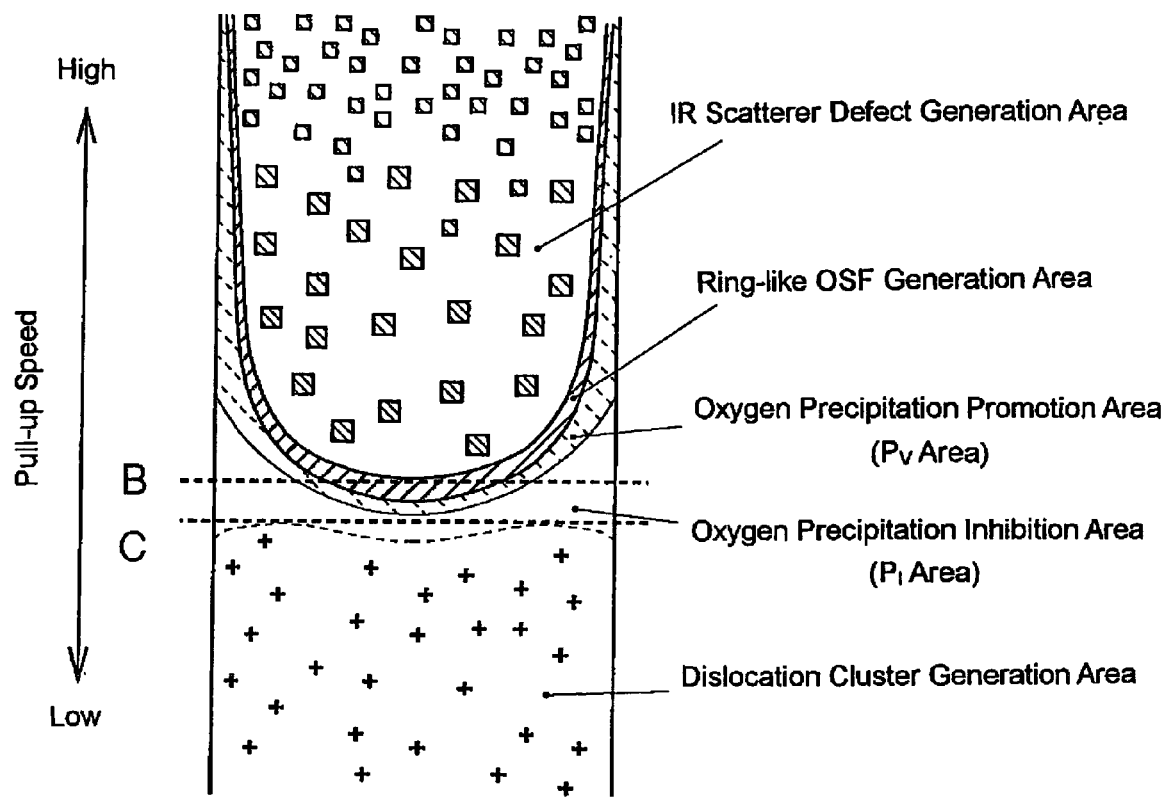
FIG. 3 is an illustrative view in the same manner as FIG. 2 for the single crystal grown by performing the pulling by a growing apparatus having a hot zone structure adapted so that the temperature gradient in pulling direction of the single crystal just after solidification is smaller in a crystal peripheral part (Ge) than in a crystal center part (Gc) or (Gc>Ge)

Single crystals were grown by use of the growing apparatus with improved hot zone structure by variously selecting the hydrogen partial pressure within the apparatus and continuously changing the pull-up speed, and the morphology of defect distribution was examined therefor in the same manner as in FIG. 2 or 3.

Figure 4:
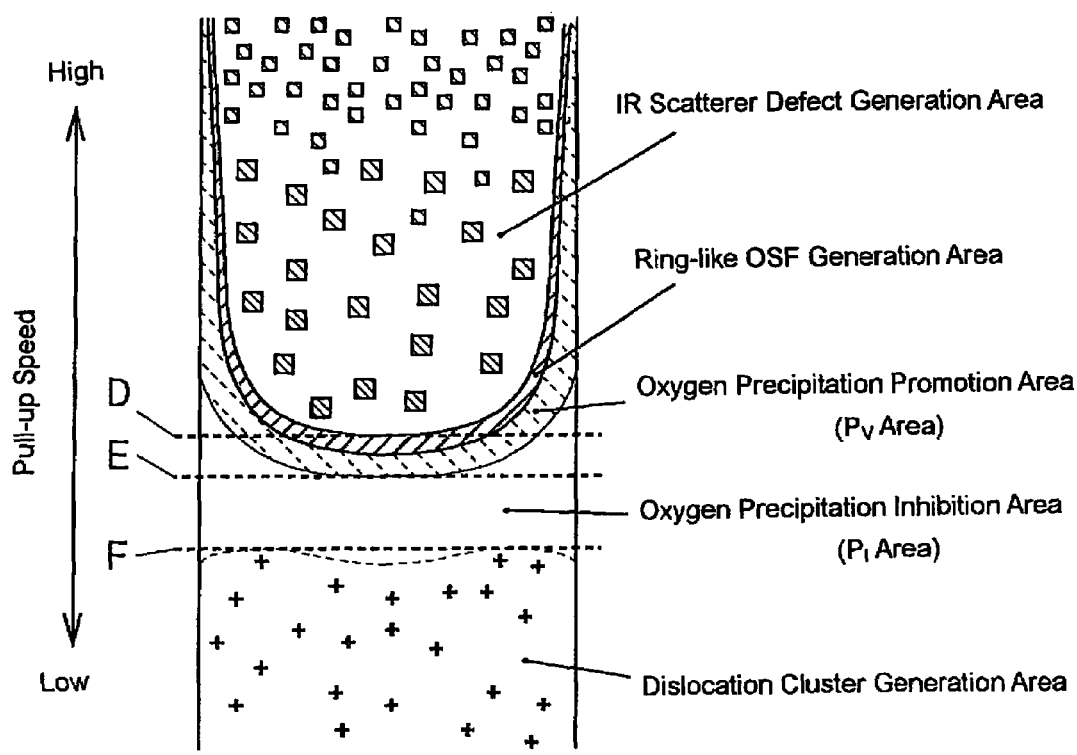
FIG. 4 is a view showing a case that, in pulling by the same growing apparatus as in FIG. 3, hydrogen is further added to the inert atmosphere within the apparatus.

As an example, the defect distribution of single crystal grown by using the same hot zone growing apparatus as in FIG. 3 at an atmospheric hydrogen partial pressure of 300 Pa as well as continuously changing the pull-up speed is shown in FIG. 4.

As is apparent from the mutual comparison of FIGS. 4 and 3, the speed range corresponding to the defect-free area which was B-C in FIG. 3 is extended to D-F in FIG. 4, and the allowable range of pull-up speed capable of producing an area of the same characteristic is increased. This shows that a wafer with minimized scatter of in-plane performance can be more easily manufactured by addition of a proper quantity of hydrogen to the atmosphere.

Figure 5:
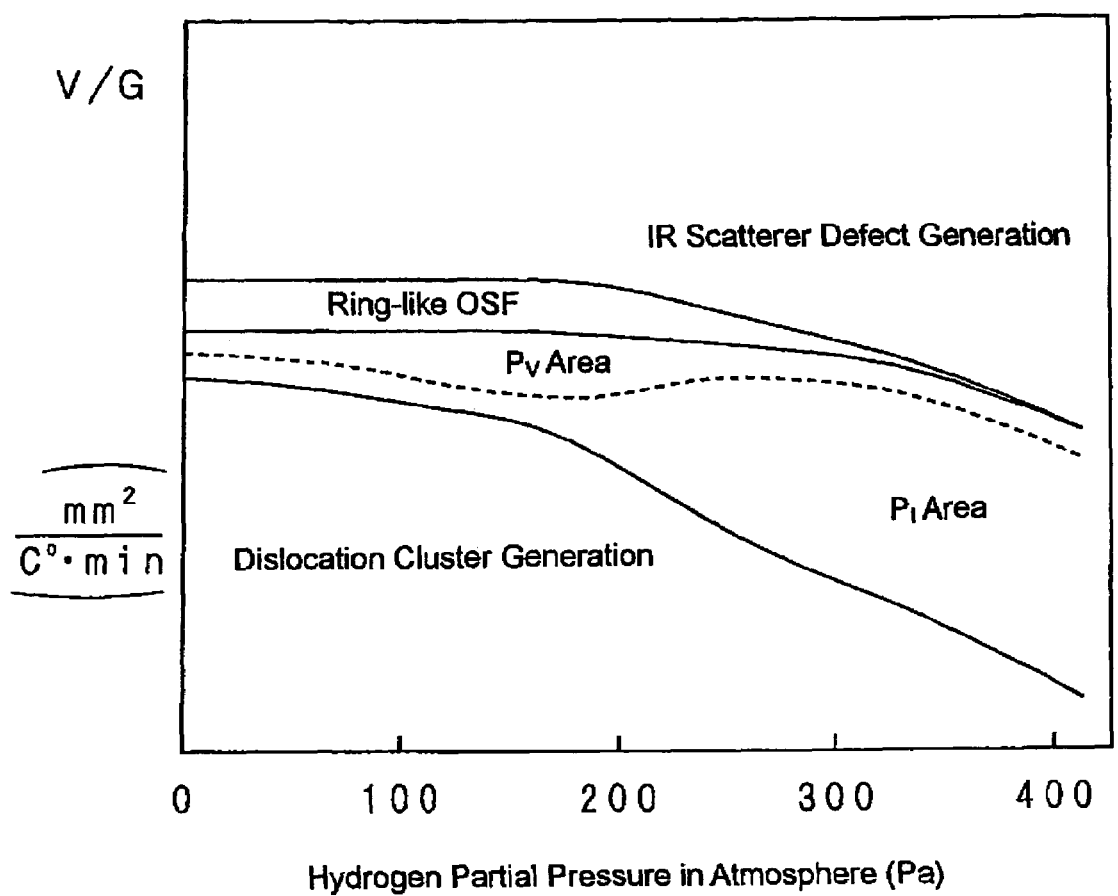
FIG. 5 is a view showing the relation between the hydrogen partial pressure and the pull-up speed range for generating a defect-free area in a case that hydrogen is added to the inert atmosphere within the growing apparatus with the hot zone structure of Gc>Ge.

Therefore, the difference in generation of the Grown-in defects depending on the pull-up speed in the center part of growing single crystal was variously examined by variously changing the atmospheric hydrogen partial pressure, and as the result, a clear tendency as shown in FIG. 5 could be observed.

Since the internal temperature distribution of single crystal during pulling is hardly changed even if the pull-up speed is changed with the same hot zone structure, the vertical axis in FIG. 5 can be regarded as the pull-up speed. Either ring-like OSF area, $P_V$ area (oxygen precipitation promotion area or vacancy-predominant defect-free area) or $P_I$ area (oxygen precipitation inhibition area or interstitial silicon-predominant defect-free area), namely the range of B-C in FIG. 3 or the range of D-F in FIG. 4, is a defect-free area free from the Grown-in defects. Thus, when single crystal is grown at pull-up speed in this range, a single crystal capable of providing a wafer composed of the defect-free area can be grown.

As is apparent from FIG. 5, although the pull-up speed capable of providing the defect-free area reduces in accordance with an increase of the hydrogen partial pressure in the atmosphere, the range of the speed gets larger as the hydrogen partial pressure is higher. With respect to the respective pull-up speed ranges for the OSF area, the $P_V$ area and the $P_I$ area, the range for the OSF area is narrowed when the hydrogen partial pressure increases, and disappears at last depending on the oxygen quantity. The range for the $P_V$ area is extended by adding hydrogen to the atmosphere within the growing apparatus in the beginning, but not extended so much thereafter, and when the hydrogen partial pressure is further increased, it is narrowed conversely. The range for the $P_I$ area is narrowed at low hydrogen partial pressure, but largely extended when the hydrogen partial pressure is increased.

As described above, in a wafer mainly composed of an area generating ordinary IR scatterer defects, BMD having an IG effect is generated within the wafer by oxygen precipitation in the process of a heat treatment for forming DZ on the surface. A wafer to be used for a substrate of integrated circuits is often required to have the IG effect for a countermeasure against contamination by heavy metal in the course of a circuit forming process, along with DZ for forming circuits on the surface.

A wafer composed of the $P_I$ area is suitably used for a SIMOX (separation-by-implanted-oxygen) or a SOI (silicon-on-insulator) substrate by lamination as it is free from oxygen precipitation, but improper for a use requiring the IG effect since no BMD can be formed.

In contrast, since the $P_V$ area is subjected to BMD formation in the inner part in the course of a DZ forming treatment and includes extremely fewer Grown-in defects which cannot be removed by the DZ forming treatment, it can provide an excellent substrate wafer having the IG effect.

However, as is apparent from D-E in FIG. 4 or FIG. 5, the pull-up speed range for providing the $P_V$ area cannot be always sufficiently extended only by controlling the hydrogen partial pressure within the growing apparatus, and it is not easy to realize a condition for providing a wafer with the $P_V$ area over the whole surface.

The hydrogen-atom-containing substance intended by the present invention is a substance which can be thermally decomposed when blended into silicon melt to supply a hydrogen atom to the silicon melt. This hydrogen atom-containing substance is introduced into the inert gas atmosphere, whereby the hydrogen concentration in the silicon melt can be improved.

Concrete examples of the hydrogen-atom-containing substance include an inorganic compound containing hydrogen atom such as hydrogen gas, $H_2O$ or HCl, a hydrocarbon such as silane gas, $CH_4$, or $C_2H_2$, and various substances containing hydrogen atoms such as alcohol or carboxylic acid. Particularly, use of hydrogen gas is desirable. As the inert gas, inexpensive Ar gas is preferred, and a single substance of various kinds of rare gas such as He, Ne, Kr or Xe, or mixed gas thereof can be used.

When oxygen gas ($O_2$) is present in the inert atmosphere, the hydrogen-atom-containing gas can exist at a concentration such that the concentration difference between the concentration of the gas in terms of hydrogen molecule and the double of the concentration of oxygen gas is 3 vol. % or more. When the concentration difference between the concentration of the hydrogen-atom-containing gas in terms of hydrogen molecule and the double of the concentration of the oxygen gas is less than 3 vol. %, the effect of inhibiting the generation of the Grown-in defects such as a COP and a dislocation cluster by the hydrogen atom taken into the silicon crystal cannot be obtained.

Since a high nitrogen concentration in the inert atmosphere might cause dislocation of the silicon crystal, the nitrogen concentration is preferably set to 20% or less within a normal furnace internal pressure of 1.3-13.3 kPa (10-100 Torr).

In the addition of hydrogen gas as the hydrogen-atom-containing substance gas, the hydrogen gas can be supplied to the inert atmosphere within the apparatus from a commercially available hydrogen gas cylinder, a hydrogen gas storage tank, a tank filled with a hydrogen storage alloy or the like through an exclusive outfitted conduit.

Conventionally, an addition of an element having a small atomic weight such as nitrogen or carbon is known to have influence on the generation or morphology change of the Grown-in defects or the distribution thereof. For example, it is described in the invention disclosed in Japanese Patent Application Publication No. 11-349394 that a defect-free area where silicon atoms are excessively present, i.e., the $P_I$ area called in the present invention, is extended by doping nitrogen. It is described in the invention disclosed in Japanese Patent Application Publication No. 2001-199794 that nitrogen and carbon are added for minimizing the size of IR scatter defects, wherein carbon has the same effect as nitrogen.

Japanese Patent Application Publication No. 2003-59932 discloses the invention for a defect-free wafer including many BMD exhibiting the IG effect based on that a defect-free area generating many BMD on the outside of the OSF ring, i.e., the $P_V$ area, is extended by doping nitrogen.

Since the doping of light elements such as nitrogen and carbon is assumed to have influence on the generation of the Grown-in defects or the formation of BMD, examinations were made for the influence thereof in case where pulling is performed in an atmosphere containing hydrogen by use of the growing apparatus improved in the hot zone, or to check whether or not this doping can be taken as a measure for extending the $P_V$ area.

In growing of single crystals doped with nitrogen or carbon by use of a growing apparatus having a hot zone of Ge<Gc by varying the nitrogen quantity or carbon quantity in melt, hydrogen was added to the apparatus internal atmosphere to examine the effect thereof. Single crystals were grown by continuously changing the pull-up speed, and distribution of defects in a vertical section of single crystal was examined for the obtained crystals by the same method as in FIGS. 2 and 3. As the result, the generation state of the defect-free area of the whole Grown-in defect including ring-like OSF, $P_V$ area and $P_I$ area was hardly changed from the case of changing the hydrogen partial pressure, and the generation speed range is slightly increased in nitrogen doping but is hardly changed in carbon doping showing that the influence of hydrogen is immense.

In the nitrogen doping, however, when the generation speed range is observed for each area, the addition of hydrogen to the atmosphere leads to significant extension of the generation speed range for the $P_V$ area up to a hydrogen partial pressure of 160 Pa. By doping a proper quantity of nitrogen, the position more than 60% of the pull-up speed range window capable of providing a defect-free area free from the Grown-in defects corresponds to the $P_V$ area. If the range is extended in this way, growing of single crystal capable of providing a wafer with the PV area over the whole surface will be extremely facilitated.

However, even if the hydrogen partial pressure is increased over 160 Pa, the speed range window capable of providing the $P_V$ area is not largely changed so much, and the ratio of the $P_I$ area is increased.

On the other hand, in the carbon doping, the speed range window of each area was not largely changed from the case of changing the hydrogen partial pressure in the atmosphere. However, when the doping quantity is increased, generation of OSF is suppressed in the area supposed to generate OSF. Therefore, the OSF area comes to have the same characteristic as the $P_V$ area free from the Grown-in defects and easily generating BMD. Therefore, when carbon is doped, the total speed range for the OSF area and the $P_V$ area can be treated as the $P_V$ area, thus resulting in extension of the $P_V$ area.

However, when the hydrogen partial pressure in the atmosphere in pulling operation is increased, the $P_I$ area is extended, and the range for the OSF area is reduced. Therefore, the effect of inhibiting generation of OSF by doping carbon becomes worthless.

Such a change in generation of defects by doping nitrogen or carbon and the reason therefor have been variously described, and it could be attributable to the interaction with vacancies or oxygen just after solidification. An addition of hydrogen thereto conceivably affects the interaction to provide the above-mentioned effect.

Based on the above-mentioned examination results, the bounds of the effects was made further clear to complete the present invention. The reason to limit the ranges in the present invention is as follows.

In the present invention, in growing a silicon single crystal by the CZ process in which the hot zone structure is improved so that the internal temperature distribution of single crystal just after solidification in pulling operation becomes Ge<Gc to extend the defect-free area, a straight trunk part of single crystal is pulled up at a speed range to cause no generation of the Grown-in defects while setting the nitrogen in single crystal to $1 \times 10^{12}$ atoms/cm$^3$ or more and $5 \times 10^{14}$ atms/cm$^3$ or less, and setting the hydrogen partial pressure in the inert gas atmosphere within the growing apparatus to 40 Pa or more and 400 Pa or less.

The wafer defect-free area of single crystal in the wafer-surface-wise direction can be extended by setting the internal temperature distribution of single crystal just after solidification to Ge<Gc and selecting the pull-up speed. And, the hot zone structure is not particularly limited if such a crystal internal temperature distribution can be obtained.

The pull-up speed range for obtaining defect-free single crystal is varied depending on the diameter of single crystal and the hot zone structure. However, since the same speed range can be adopted if the apparatus and the crystal diameter are the same, a single crystal is preliminarily grown while continuously changing the pull-up speed, and the speed range can be examined and selected based thereon.

The addition of nitrogen has the effect on largely extending the speed range capable of providing the $P_V$ area. The quantity of nitrogen is set to $1 \times 10^{12}$ atoms/cm$^3$ or more and $5 \times 10^{14}$ atoms/cm$^3$ or less, since the effect of adding nitrogen is not sufficient to extend the $P_V$ area at less than $1 \times 10^{12}$ atoms/cm$^3$, and at an excessive quantity exceeding $5 \times 10^{14}$ atoms/cm$^3$, dislocation is likely to occur or an OSF generation area may be extended.

The reason for setting the hydrogen partial pressure to 40 Pa or more and 400 Pa or less is that the effect of adding hydrogen to the atmosphere cannot be sufficiently obtained at less than 40 Pa, and a giant vacancy defect called a hydrogen defect is apt to generate at a hydrogen partial pressure exceeding 400 Pa. The pressure of the apparatus internal atmospheric gas during growing is not particularly limited if the hydrogen partial pressure is within the above range, and any pressure applied to normal growing can be adopted.

The hydrogen partial pressure in the apparatus internal atmosphere is controlled in the growing apparatus of the hot zone structure which is to realize the internal temperature distribution of single crystal just after solidification capable of extending the defect-free area, whereby the defect-free area can be further extended. Since the $P_I$ area (interstitial silicon-predominant defect-free area) is extended in this case, growing of single crystal capable of providing a wafer composed of the $P_I$ area can be facilitated by selecting the pull-up speed. However, since the $P_V$ area (vacancy-predominant defect-free area) can be particularly extended by further adding nitrogen, this can be applied for the purpose of growing single crystal capable of providing a wafer composed of the $P_V$ area by selecting the pull-up speed.

In the present invention, in growing a silicon single crystal by the CZ process in which the hot zone structure is improved so that the internal temperature distribution of single crystal just after solidification in pulling operation is Ge<Gc to extend the defect-free area, a trunk part of single crystal is pulled up in a speed range to cause no generation of the Grown-in defects while setting carbon in single crystal to $5 \times 10^{15}$ atoms/cm$^3$ or more and $2 \times 10^{17}$ atoms/cm$^3$ or less (ASTM F123-1981), and setting the hydrogen partial pressure in the atmosphere gas within the growing apparatus to 40 Pa or more and 160 Pa or less.

An addition of carbon is effective to inhibit the generation of OSF in the OSF area. As described above, the OSF area in which generation of OSF is inhibited generates sufficient BMD in the inner part without defects, similarly to the $P_V$ area. Accordingly, the $P_V$ area is consequently extended as a wafer, and the speed range can be treated in the form of "OSF area+original $P_V$ area".

The reason to set the quantity of carbon to $5 \times 10^{15}$ atoms/cm$^3$ or more and $2 \times 10^{17}$ atoms/cm$^3$ or less is that the effect of carbon addition is insufficient at less than $5 \times 10^{15}$ atoms/cm$^3$, and generation of bulk defects undesirably increases at more than $2 \times 10^{17}$ atoms/cm$^3$.

The reason for setting the hydrogen partial pressure in the atmospheric gas within the apparatus during growing to 40 Pa or more and 160 Pa or less is that the effect of hydrogen addition to the atmosphere is not sufficiently obtained at less than 40 Pa, and when the hydrogen partial pressure is increased over 160 Pa, the range for the OSF area is contracted to narrow the range for the "OSF area+original $P_V$ area" supposed to generate BMD, even if the OSF generation in this area is inhibited.

As described above, in the growing apparatus with the hot zone structure which is to realize the internal temperature distribution of single crystal just after solidification capable of extending the defect-free area, carbon is added and doped while controlling the quantity in order to control the hydrogen partial pressure in the apparatus internal atmosphere, whereby the OSF area comes to exhibit the same property as the $P_V$ area (vacancy-predominant defect-free area) with inhibition of OSF generation therein. Since the area supposed to generate BMD can be extended, this is preferably applied for a purpose of growing single crystal capable of providing a wafer composed of the "OSF area+original $P_V$ area".

In the present invention, further, in growing a silicon single crystal by the CZ process in which the hot zone structure is improved so that the internal temperature distribution of single crystal just after solidification in puffing operation is Ge<Gc to extend the defect-free area, a trunk part of single crystal is pulled up in a speed range to cause no generation of the Grown-in defects while setting nitrogen in single crystal to $1 \times 10^{12}$ atoms/cm$^3$ or more and $5 \times 10^{14}$ atoms/cm$^3$ or less and carbon to $5 \times 10^{15}$ atoms/cm$^3$ or more and $2 \times 10^{17}$ atoms/cm$^3$ or less (ASTM F123-1981), and setting the hydrogen partial pressure in the atmosphere gas within the growing apparatus to 40 Pa or more and 400 Pa or less.

The hydrogen partial pressure in the apparatus internal atmosphere is controlled in the growing apparatus of the hot zone structure which is to realize the internal temperature distribution of single crystal just after solidification capable of extending the defect-free area, whereby the defect-free area can be further extended. In this case, since the addition of nitrogen is effective to largely extend the speed range capable of providing the $P_V$ area, and the addition of carbon is effective to inhibit generation of OSF in the OSF area, growing a single crystal capable of providing a wafer with a defect-free area free from the Grown-in defects over the whole surface and capable of sufficiently and uniformly forming BMD is further facilitated.

The wafer produced from the silicon single crystal thus obtained can be subjected to a rapid thermal annealing (RTA) treatment in the inert gas atmosphere or in a mixed atmosphere of ammonia and inert gas under conditions of a heating temperature of 800-1200° C. and heating time of 1-600 min. Vacancies are injected into the wafer by performing the RTA treatment in the inert gas atmosphere or in the mixed atmosphere of ammonia and inert gas.

Since the wafer intended by the present invention is a silicon wafer composed of a defect-free area and free from an aggregate of point defects, interstitial silicon type point defects which annihilate the injected vacancies are hardly present therein, and vacancies necessary for oxygen precipitation can be efficiently injected. Since vacancy type point defects are hardly present as well, a sufficient vacancy density can be ensured by the RTA treatment.

A heat treatment is performed in the subsequent low-temperature process for device, whereby the precipitation of oxygen to vacancies is promoted with stabilization of oxygen precipitation nucleus by the heat treatment, and the growth of precipitates is performed. Namely, this RTA treatment enables sufficient homogenization of the oxygen precipitation within the wafer surface and improvement of the gettering capability in the surface layer part in the vicinity of the outermost surface layer of wafer in which a device structure is to be formed.

In the method of the present invention, a defect-free silicon wafer having an oxygen concentration of $1.2 \times 10^{18}$ atoms/cm$^3$ (ASTM F 121, 1979) or more can be manufactured.

When the oxygen concentration in wafer is increased, the generation quantity of BMD is increased, and the strength of wafer can be improved. However, since an excessively high concentration facilitates generation of oxygen precipitates and secondary defects thereby in the device active area to deteriorate circuit characteristics, the oxygen concentration in single crystal is generally limited to $1.2 \times 10^{18}$ atoms/cm$^3$ or less.

In the method of the present invention, in contrast, the formation of the ring-like OSF which emerges in crystal can be inhibited by an addition of carbon, and the allowable upper limit (concentration margin) of oxygen concentration which was set forth in association with the appearance of OSF cores can be consequently raised and relaxed. Therefore, a wafer composed of the defect-free area can be grown without deteriorating the device characteristics even in an oxygen concentration level of $1.2 \times 10^{18}$ atoms/cm$^3$ or more. This is conceivably resulted from the reduction in precipitation sites of oxygen precipitates by the interaction of hydrogen and vacancies.

Since an excessively high oxygen concentration extinguishes this precipitation inhibition effect, the oxygen concentration is preferably set up to $1.6 \times 10^{18}$ atoms/cm$^3$ at a maximum.

EXAMPLES

Example 1

Figure 6:
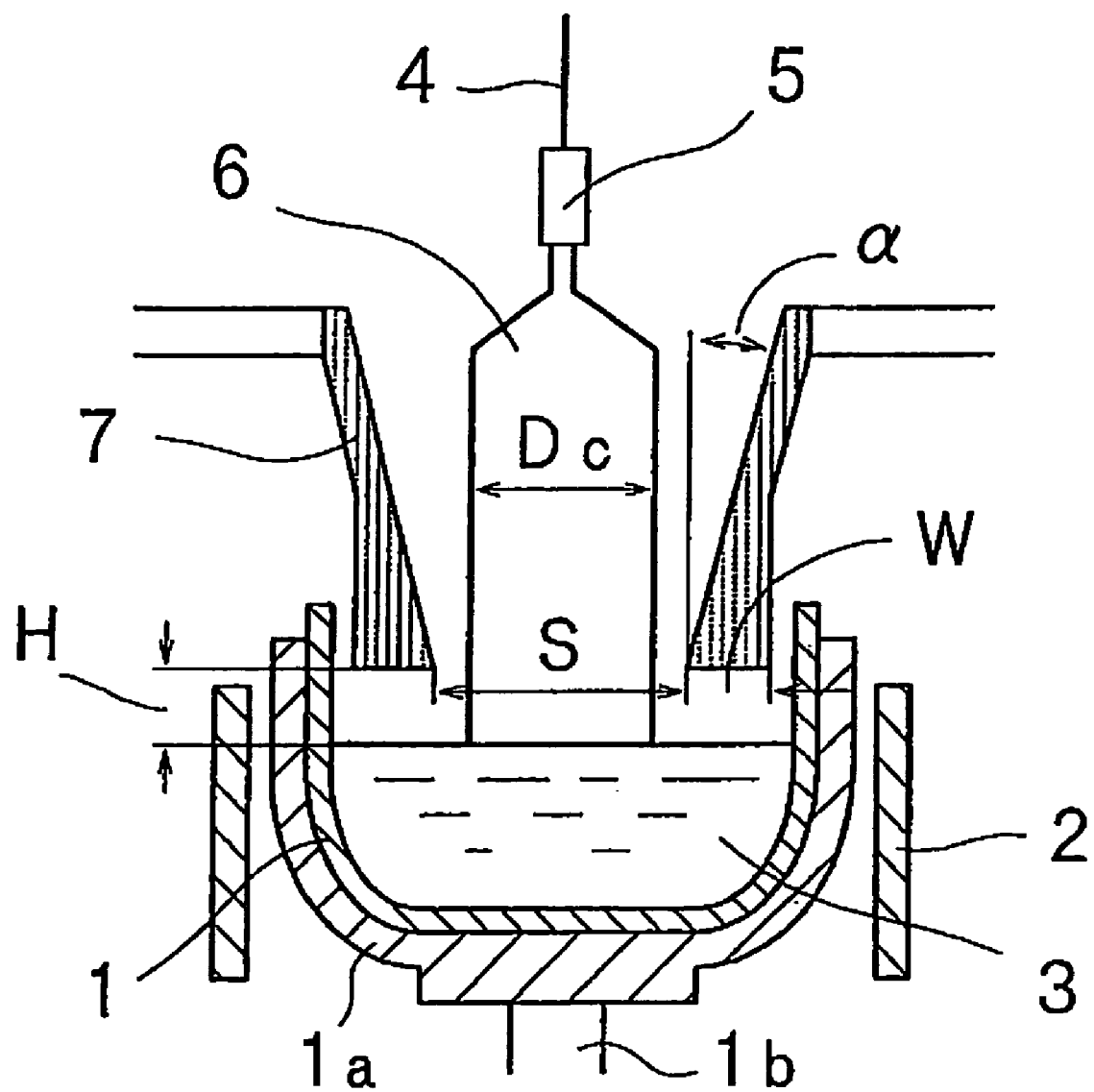
FIG. 6 is a view schematically illustrating a configuration example of a silicon single crystal growing apparatus used in producing Examples.

A growing experiment was carried out by use of an apparatus having a sectional structure schematically shown in FIG. 6. In this drawing, a heat shielding body 7 has a structure consisting of an outer shell made of graphite and the interia filled with graphite felt therein, with an outer diameter of a portion to be put into a crucible of 480 mm, a minimum inside diameter S at the bottom end of 270 mm, and a radial width W of 105 mm, the inner surface of which is a reverse truncated conical face started from the lower end with an inclination with respect to the vertical direction of 21°. The crucible 1 has an inside diameter of 550 mm, and the height H of the lower end of the heat shielding body 7 from melt surface is 60 mm.

In this growing apparatus, the heat shielding body 7 is set to have a large thickness for a lower end part thickness and a large height H of its lower endmost from the melt surface, so that the temperature distribution within the single crystal pulled up from the melt satisfies Gc<Ge in a temperature range of from the melting point to 1250° C.

Polycrystal of high purity silicon was charged in the crucible, and the crucible was heated by a heater 2 while laying the apparatus in a pressure-reduced atmosphere to dissolve the silicon into melt 3. A seed crystal attached to a seed chuck 5 was immersed in the melt 3 and pulled up while rotating the crucible 1 and a pulling shaft 4. After seed tightening for making crystal dislocation free was performed, a shoulder part was formed followed by shoulder changing, and a trunk part was then formed.

Using the growing apparatus having the hot zone structure shown in FIG. 6, the single crystal was grown with a target diameter of a trunk part of 200 mm; axial internal temperature gradients of the single crystal under growing of 3.0-3.2° C./mm in the center part and 2.3-2.5° C./mm in the peripheral part within a temperature range from the melting point to 1370° C.; and an apparatus internal atmospheric pressure of 4000 Pa, while changing the pull-up speed to 0.6mm/min to 0.3 mm/min to 0.6 mm/min. In this case, the growing was carried out by changing the hydrogen partial pressure of the apparatus internal atmosphere to following 6 levels, 0 without addition of hydrogen, and 20 Pa, 40 Pa, 160 Pa, 240 Pa and 400 Pa with addition of hydrogen gas.

The resulting single crystal was vertically cut along the pulling axis to prepare a sheet-like test piece including the vicinity of the pulling axis in plane, and distribution of the Grown-in defects therein was observed. In the observation, the piece was immersed in an aqueous solution of copper sulfide followed by drying, heated in nitrogen atmosphere at 900° C. for 20 minutes followed by cooling, and immersed in a hydrofluoric acid-nitric acid mixture to remove a Cu-silicide layer in the surface layer by etching, and the position of OSF ring or the distribution of each defect area were examined by X-ray topography. The growing conditions and examination results are shown in Table 1.

TABLE 1

| Crystal No. | Nitrogen Concentration (atoms/cm$^3$) | Hydrogen partial pressure in atmosphere (Pa) | Pull-up speed range (mm/min) Defect-free area | Pv area | Notes |
|---|---|---|---|---|---|
| 1 | *— | *— | 0.0384 | 0.0054 | Comparative Example |
| 2 | $5.2 \times 10^{13}$ | 40 | 0.0442 | 0.0341 | Inventive Example |
| 3 | $5.8 \times 10^{13}$ | 160 | 0.0510 | 0.0398 | Inventive Example |
| 4 | $6.2 \times 10^{13}$ | 400 | 0.0767 | 0.0461 | Inventive Example |
| 5 | *— | 160 | 0.0502 | 0.0217 | Comparative Example |
| 6 | *$8.9 \times 10^{11}$ | 160 | 0.0498 | 0.0180 | Comparative Example |
| 7 | $1.2 \times 10^{12}$ | 160 | 0.0511 | 0.0318 | Inventive Example |
| 8 | $4.7 \times 10^{14}$ | 160 | 0.0563 | 0.0485 | Inventive Example |

*Out of the range defined in the present invention.
"—": No addition

In Table 1, the aggregate of the OSF area, the P$_v$ area and the P$_I$ area is designated as the defect-free area. The pull-up speed range shows the range of speed in case where the pull-up speed is continuously changed, which is measured in the center of single crystal. When the pulling up is performed in this speed range, a single crystal in which 80% or more of wafer surface is composed of the relevant area can be obtained. The larger the speed range, the lesser the scatter of in-plane performance of wafer, and the production is facilitated.

Comparing the pull-up speed ranges of crystals in Table 1, the defect-free area is extended by addition of hydrogen gas into the atmosphere. Comparing No. 1 with Nos. 2-4, it is apparent that the speed range for the $P_V$ area is largely extended by addition of nitrogen. Further, comparing No. 5 with Nos. 6-8, the speed range for the $P_V$ area is largely extended at an addition quantity of nitrogen of $1 \times 10^{12}$ atoms/cm$^3$ or more.

Example 2

Using the same growing apparatus as in Example 1, single crystals were grown by varying the pull-up speed from 0.6 mm/min to 0.3 mm/min to 0.6 mm/min at a pressure of the apparatus internal atmosphere of 4000 Pa, wherein the hydrogen partial pressure of the apparatus internal atmosphere and the carbon quantity to be doped to crystals were varied.

The resulting single crystals were examined for distribution of each defect area in the same manner as in Example 1. The OSF density was examined by optical microscopic observation after heat treatment was performed at 1100° C in dry oxygen atmosphere for 16 hours followed by 3 μm-light etching on above section. The growing conditions and examination results are shown in Table 2.

TABLE 2

| Crystal No. | Carbon Concentration (atoms/cm$^3$) | Hydrogen partial pressure in atmosphere (Pa) | Pull-up speed range (mm/min) Defect-free area | Pull-up speed range (mm/min) $P_V$ + OSF area | OSF density generated in OSF area (piece/cm$^2$) | Notes |
|---|---|---|---|---|---|---|
| 1 | *— | *— | 0.0384 | 0.0275 | 5.2 × 10$^4$ | Comparative Example |
| 9 | 2.3 × 10$^{16}$ | 40 | 0.0438 | 0.0353 | <1 × 10$^2$ | Inventive Example |
| 10 | 2.1 × 10$^{16}$ | 160 | 0.0501 | 0.0431 | <1 × 10$^2$ | Inventive Example |
| 11 | 3.0 × 10$^{16}$ | *240 | 0.0759 | 0.0267 | <1 × 10$^2$ | Comparative Example |
| 12 | *2.3 × 10$^{15}$ | 160 | 0.0511 | 0.0429 | 4.8 × 10$^4$ | Comparative Example |
| 13 | 5.5 × 10$^{15}$ | 160 | 0.0502 | 0.0437 | <1 × 10$^2$ | Inventive Example. |
| 14 | 1.7 × 10$^{17}$ | 160 | 0.0499 | 0.0428 | <1 × 10$^2$ | Inventive Example |

*Out of the range defined in the present invention.
"—": No addition

As is apparent from the comparison of No. 1 with Nos. 9-11 in Table 2, the defect-free area is extended by an increase in hydrogen partial pressure within the apparatus, and generation of OSF is largely reduced by addition of carbon. However, since the OSF area is reduced at a hydrogen partial pressure exceeding 160 Pa, the speed range for the "OSF area+$P_V$ area" is reduced, and the pull-up speed range capable of providing defect-free and sufficient BMD is narrowed.

In mutual comparison of Nos. 12 and 13, the inhibition of generation of OSF is insufficient when the addition quantity of carbon is lower than $5 \times 10^5$ atoms/cm$^3$.

Example 3

By use of the same growing apparatus as in Example 1, four kinds of single crystals in total were grown with parameters comprising an apparatus atmospheric gas pressure of 4000 Pa; a hydrogen partial pressure of 160 Pa; and a pull-up speed of 0.397 mm/min capable of making the center of wafer an OSF generation area, wherein two levels of oxygen concentration of $1.0 \times 10^{18}$ atoms/cm$^3$ and $1.3 \times 10^{18}$ atoms/cm$^3$ are made, and wherein the cases with and without doping of carbon to each level of oxygen concentration are included.

Figure 7:
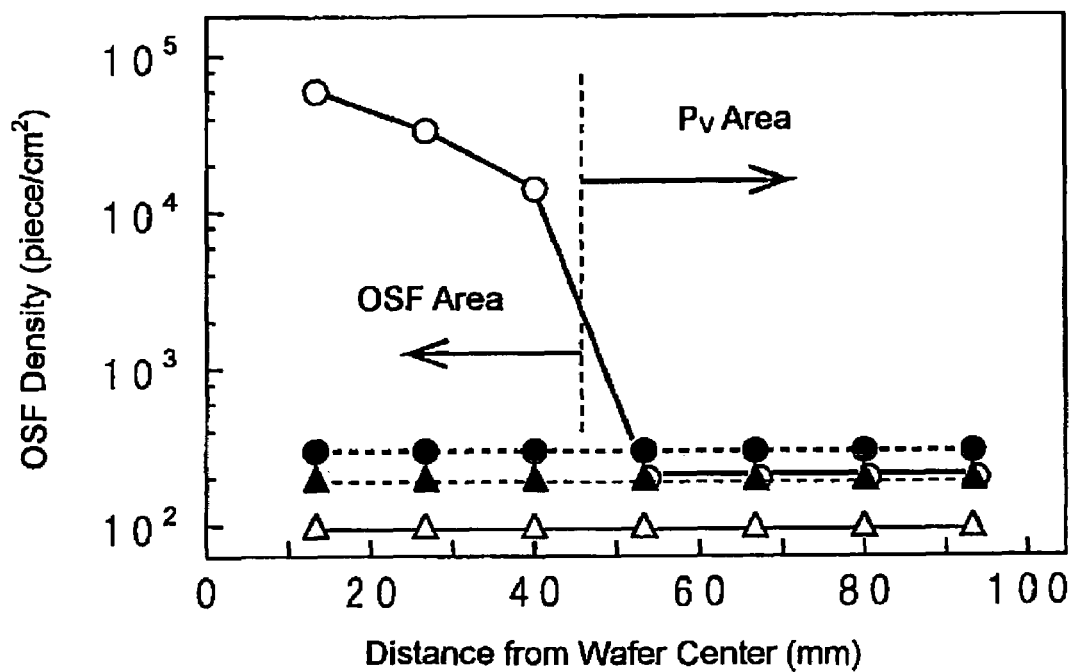
FIG. 7 is a view illustrating that generation of OSF can be inhibited by adding carbon even where OSF ought to generate in the OSF area in the very center of a wafer because of high oxygen concentration.

Wafers were cut from the center part of the resulting single crystals, subjected to heat treatment for OSF generation by heating at 1100° C. for 16 hours in dry oxygen atmosphere, and examined for the OSF density at sections. The examination result is shown in FIG. 7.

In No. 15 with sufficiently low oxygen, OSF is not substantially generated, but in No. 17 with oxygen exceeding $1.2 \times 10^{18}$ atoms/cm$^3$, a number of OSF is generated in the OSF area. In No. 18 of the same high oxygen but doped with C, the generation of OSF is inhibited even in the OSF area.

What is claimed is:

1. A method for manufacturing a silicon single crystal, comprising the steps of:
   growing said silicon single crystal composed of a defect-free area free from the Grown-in defects by the Czochralski process;
   setting nitrogen in the single crystal to $1 \times 10^{12}$ atoms/cm$^3$ or more and $5 \times 10^{14}$ atoms/cm$^3$ or less;
   setting hydrogen partial pressure in an atmosphere gas within a growing apparatus to 40 Pa or more and 400 Pa or less; and
   pulling up a trunk part of single crystal within a speed range to cause no generation of the Grown-in defects.

2. A method for manufacturing a silicon single crystal, comprising the steps of:
   growing said silicon single crystal composed of a defect-free area free from the Grown-in defects by the Czochralski process;
   setting nitrogen in the single crystal to $1 \times 10^{12}$ atoms/cm$^3$ or more and $5 \times 10^{14}$ atoms/cm$^3$ or less;
   setting hydrogen partial pressure in an atmosphere gas within a growing apparatus to 40 Pa or more and 400 Pa or less; and
   pulling up a trunk part of single crystal within a speed range to cause the formation of vacancy-predominant defect-free area.

3. A method for manufacturing a silicon single crystal, comprising the steps of: growing said silicon single crystal composed of a defect-free area free from the Grown-in defects by the Czochralski process;
   setting carbon in the single crystal to $5 \times 10^{15}$ atoms/cm$^3$ or more and $2 \times 10^{17}$ atoms/cm$^3$ or less (ASTMF123-1981);

setting hydrogen partial pressure in an atmosphere gas within a growing apparatus to 40 Pa or more and 160 Pa or less; and pulling up a trunk part of single crystal within a speed range to cause no generation of the Grown-in defects.

4. A method for manufacturing a silicon single crystal, comprising the steps of:

growing said silicon single crystal composed of a defect-free area free from the Grown-in defects by the Czocbralski process;

setting carbon in the single crystal to $5\times10^{15}$ atoms/cm$^3$ or more and $2\times10^{17}$ atoms/cm$^3$ or less (ASTMF123-1981);

setting hydrogen partial pressure in an atmosphere gas within a growing apparatus to 40 Pa or more and 160 Pa or less; and pulling up a trunk part of single crystal within the sum of speed ranges for an OSF area and a vacancy-predominant defect-free area.

5. A method for manufacturing a silicon single crystal, comprising the steps of:

growing said silicon single crystal composed of a defect-free area free from the Grown-in defects by the Czochralski process;

setting nitrogen in the single crystal to $1\times10^{12}$ atoms/cm$^3$ or more and $5\times10^{14}$ atoms/cm$^3$ or less;

setting carbon in the single crystal to $5\times10^{15}$ atoms/cm$^3$ or more and $2\times10^{17}$ atoms/cm$^3$ or less (ASTMF123-1981);

setting hydrogen partial pressure in an atmosphere gas within a growing apparatus to 40 Pa or more and 400 Pa or less; and pulling up a trunk part of single crystal within a speed range to cause no generation of the Grown-in defects.

* * * * *